US012805256B2

(12) United States Patent
Minamihata et al.

(10) Patent No.: US 12,805,256 B2
(45) Date of Patent: Nov. 17, 2026

(54) HOLDING MEMBER AND ELECTROSTATIC CHUCK

(71) Applicant: Niterra Co., Ltd., Nagoya (JP)

(72) Inventors: Yuya Minamihata, Nagoya (JP); Hideki Uematsu, Nagoya (JP); Takashi Yamaguchi, Nagoya (JP); Akira Inayoshi, Nagoya (JP)

(73) Assignee: NITERRA CO., LTD., Nagoya (JP)

(*) Notice: Subject to any disclaimer, the term of this patent is extended or adjusted under 35 U.S.C. 154(b) by 156 days.

(21) Appl. No.: 18/855,579

(22) PCT Filed: Mar. 15, 2023

(86) PCT No.: PCT/JP2023/010018
§ 371 (c)(1),
(2) Date: Oct. 9, 2024

(87) PCT Pub. No.: WO2023/199686
PCT Pub. Date: Oct. 19, 2023

(65) Prior Publication Data

US 2025/0246471 A1 Jul. 31, 2025

(30) Foreign Application Priority Data

Apr. 15, 2022 (JP) ................................ 2022-067322

(51) Int. Cl.
*H10P 72/72* (2026.01)
*H10P 72/76* (2026.01)

(52) U.S. Cl.
CPC ........ *H10P 72/722* (2026.01); *H10P 72/7616* (2026.01)

(58) Field of Classification Search
CPC . H01L 21/683; H01L 21/687; H01L 21/6833; H01L 21/68757; H02N 13/00;
(Continued)

(56) References Cited

U.S. PATENT DOCUMENTS

2004/0187791 A1 9/2004 Busse et al.
2013/0201598 A1 8/2013 Ishikawa et al.
(Continued)

FOREIGN PATENT DOCUMENTS

JP 2005-101505 A 4/2005
JP 2005-142591 A 6/2005
(Continued)

OTHER PUBLICATIONS

Japan Patent Office, Office Action (Notice of Reasons for Refusal) issued in corresponding Application No. JP2023157415 issued Apr. 15, 2025.
(Continued)

*Primary Examiner* — Danny Nguyen
(74) *Attorney, Agent, or Firm* — Stites & Harbison PLLC; Jeffrey A. Haeberlin; Wanli Wu

(57) ABSTRACT

A holding member contains ceramic as a main component and holds a target object. The holding member has a holding surface as a surface on a side on which the target object is held. A surface as at least a portion of the holding surface is formed from first ceramic crystal grains. An inner portion of the holding member relative to the holding surface is formed from second ceramic crystal grains. A first grain diameter as a grain diameter of the first ceramic crystal grains is smaller than a second grain diameter as a grain diameter of the second ceramic crystal grains.

6 Claims, 4 Drawing Sheets

(58) Field of Classification Search
CPC ........ H10P 72/722; H10P 72/70; H10P 72/72; B23K 26/352
USPC .......................................................... 361/234
See application file for complete search history.

(56) References Cited

U.S. PATENT DOCUMENTS

| | | | |
|---|---|---|---|
| 2019/0114244 A1 | 4/2019 | Inoue | |
| 2019/0115244 A1 | 4/2019 | Inoue | |
| 2020/0211884 A1* | 7/2020 | Hidaka | C04B 35/117 |
| 2021/0013081 A1* | 1/2021 | Kosakai | H10P 72/7614 |
| 2022/0055343 A1 | 2/2022 | Takahashi et al. | |

FOREIGN PATENT DOCUMENTS

| | | | |
|---|---|---|---|
| JP | 2012-060107 | A | 3/2012 |
| JP | 2020-129632 | A | 8/2020 |
| JP | 2023-105609 | A | 7/2023 |
| KR | 20180118705 | A | 10/2018 |
| WO | 2017-170738 | A1 | 10/2017 |
| WO | 2020144992 | A1 | 7/2020 |

OTHER PUBLICATIONS

Taiwan Intellectual Property Office, Ministry of Economic Affairs, Office Action (Notification for the Opinion of Examination) issued in corresponding Application No. TW112113995 issued Apr. 14, 2025.

Korean Intellectual Property Office, Office Action (Request for the Submission of an Opinion) issued in corresponding Application No. 10-2024-7033427, issued Nov. 26, 2025.

Japan Patent Office, International Search Report issued in corresponding Application No. PCT/JP2023/010018 mailed May 9, 2023.

Japan Patent Office, Office Action (Notice of Reasons for Refusal) issued in corresponding Application No. JP 2023-157415, issued Nov. 26, 2024.

Korean Intellectual Property Office, Office Action (Request for the Submission of an Opinion) issued in corresponding Application No. KR 10-2024-7033427, Dispatched Mar. 13, 2025.

* cited by examiner

HOLDING MEMBER AND ELECTROSTATIC CHUCK

TECHNICAL FIELD

The present invention relates to a holding member and an electrostatic chuck.

BACKGROUND ART

Electrostatic chucks for holding wafers as target objects by electrostatic attraction have been known as holding members for holding target objects. For example, Patent Document 1 discloses an electrostatic chuck including a ceramic member having a holding surface on a side on which a target object is held, the holding surface having recesses formed through blast processing.

PRIOR ART DOCUMENT

Patent Document

Patent Document 1: Japanese Patent Application No. 2020-129632

SUMMARY OF THE INVENTION

Problem to be Solved by the Invention

However, the blast processing is processing that involves separating crystal grains over the entireties thereof along respective grain boundaries, and thus the electrostatic chuck described in Patent Document 1 raises concerns that: the surface roughness of the holding surface increases; and furthermore, the area of grain boundaries exposed from the holding surface increases. Each grain boundary which is the boundary between crystal grains is a region in which atomic arrangement is disarrayed. The plasma resistance of the region is lower than the plasma resistance inside the crystal grains. Thus, there is room for enhancement in the plasma resistance of the holding surface of the holding member.

The present invention has been made to solve at least one of the above problems, and an object of the present invention is to provide a holding member and an electrostatic chuck in which the plasma resistance of a holding surface can be improved.

Means for Solving the Problem

The present invention has been made to solve at least one of the above problems and can be implemented as the following aspects.

(1) One aspect of the present invention provides a holding member. The holding member is a holding member containing ceramic as a main component and configured to hold a target object. The holding member has a holding surface as a surface on a side on which the target object is held. A surface as at least a portion of the holding surface is formed from first ceramic crystal grains. An inner portion of the holding member relative to the holding surface is formed from second ceramic crystal grains. A first grain diameter as a grain diameter of the first ceramic crystal grains is smaller than a second grain diameter as a grain diameter of the second ceramic crystal grains.

According to this configuration, the surface as at least a portion of the holding surface is formed from the first ceramic crystal grains, and the inner portion of the holding member relative to the holding surface is formed from the second ceramic crystal grains. Furthermore, the first grain diameter as the grain diameter of the first ceramic crystal grains is smaller than the second grain diameter as the grain diameter of the second ceramic crystal grains. Consequently, since the surface as at least a portion of the holding surface is formed from the first ceramic crystal grains having the first grain diameter smaller than the second grain diameter, the sizes of particles to be generated from the holding surface at the time of using the holding member can be decreased. In addition, the first ceramic crystal grains correspond to ceramic crystal grains obtained by partially cutting the second ceramic crystal grains, and thus the surface formed from the first ceramic crystal grains contains ceramic crystal grains each having an inside (the inner portion of the crystal grain relative to a corresponding grain boundary) that is exposed toward the surface. That is, regarding such a surface, less grain boundaries are exposed from the surface, whereby the plasma resistance of the holding surface including such a surface can be improved.

(2) In the holding member of the above aspect, a protrusion and a recess may be formed on the holding surface, and the surface may be a bottom surface delimiting the recess.

According to this configuration, the bottom surface delimiting the recess is formed from the first ceramic crystal grains. Consequently, the sizes of particles to be generated, while the holding member is holding a target object, from the holding surface by flow of an inert gas between the target object and the recess can be decreased.

(3) In the holding member of the above aspect, the surface may be a laser processing surface.

According to this configuration, the laser processing surface as a surface subjected to laser processing is a surface obtained by finely cutting each of crystal grains progressively from a corresponding grain boundary toward the inside of the grain, and thus the first grain diameter of the first ceramic crystal grains is smaller than the second grain diameter. Therefore, a holding member in which the first grain diameter is smaller than the second grain diameter can be accurately provided. In addition, the surface roughness of the laser processing surface can be made lower than the surface roughness of a blast processing surface obtained by performing blast processing that involves separating crystal grains over the entireties thereof along respective grain boundaries. That is, increase in surface area due to surface roughness can be suppressed. As a result, the surface area within which corrosion due to plasma occurs is decreased, whereby generation of particles through corrosion due to plasma can be suppressed.

(4) Another aspect of the present invention provides an electrostatic chuck. The electrostatic chuck includes: the holding member in accordance with the above aspect; and an electrostatic electrode configured to generate electrostatic attraction on the holding surface.

According to this configuration, electrostatic attraction (attracting force) is generated by supplying power to the electrostatic electrode, and a target object can be held on the holding surface side by this electrostatic attraction. In addition, since the first grain diameter is smaller than the second grain diameter, it is possible to provide an electrostatic chuck in which: the sizes of particles to be generated from the holding surface at the time of using the holding member are decreased; and furthermore, the plasma resistance is improved.

The present invention can be implemented in various aspects. For example, the present invention can be implemented in aspects such as a holding member, an electrostatic chuck, a vacuum chuck, a ceramic heater, a semiconductor manufacturing device, a part provided therewith, and a manufacturing method therefor.

MODES FOR CARRYING OUT THE INVENTION

First Embodiment

Figure 1:
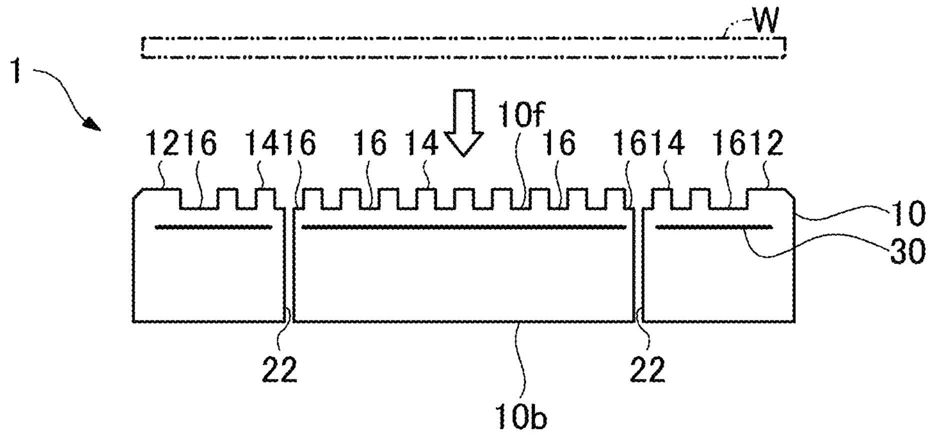
FIG. 1 Diagram schematically showing a cross-sectional configuration of an electrostatic chuck of a first embodiment.

FIG. 1 is a diagram schematically showing a cross-sectional configuration of an electrostatic chuck 1 of a first embodiment. The electrostatic chuck 1 is a device for attracting and holding a semiconductor wafer W as a target object by electrostatic attraction. The arrow shown in FIG. 1 indicates the direction in which the semiconductor wafer W is attracted to the electrostatic chuck 1. The electrostatic chuck 1 is used for, for example, fixing the semiconductor wafer W inside a vacuum chamber of a semiconductor manufacturing device. The electrostatic chuck 1 includes a holding member 10 and an electrostatic electrode 30.

The holding member 10 is a disc-shaped member and is formed to contain ceramic as a main component. The main component refers to a component having the highest volume content. A constituent material of the holding member 10 is exemplified by aluminum oxide (alumina), aluminum nitride, and the like. The constituent material in the present embodiment is alumina. In the present embodiment, the holding member 10 is implemented by one member formed from a ceramic material. The holding member 10 has a holding surface 10*f* and a back surface 10*b*. The holding surface 10*f* is a circular surface on a side on which the semiconductor wafer W is held. The back surface 10*b* is a circular surface located on a side opposite to the holding surface 10*f*.

On the holding surface 10*f*, an annular protrusion 12, a plurality of protrusions 14, and a plurality of recesses 16 are formed. The annular protrusion 12 is formed along the outer edge of the holding surface 10*f*. Each of the protrusions 14 is formed on the inner side relative to the annular protrusion 12. Each of the recesses 16 is formed between corresponding ones of the protrusions 14. In other words, the positions at which the recesses 16 are formed are positions that are on the inner side relative to the annular protrusion 12 and at which the protrusions 14 are not formed. In the present embodiment, when the holding surface 10*f* is viewed in such a direction as to face the holding surface 10*f* (in a plan view), the recesses 16 are arranged to be sporadically present on the circular holding surface 10*f*, and the proportion of the recesses 16 in the holding surface 10*f* is 90% or higher.

A plurality of penetrating flow paths 22 are formed inside the holding member 10. Each of the penetrating flow paths 22 is a flow path penetrating between the holding surface 10*f* and the back surface 10*b* and is a flow path for supplying, to the holding surface 10*f* side, an inert gas such as helium gas supplied from the back surface 10*b* side. The penetrating flow path 22 leads to the corresponding recess 16 on the holding surface 10*f* side.

The electrostatic electrode 30 is a disc-shaped member provided inside the holding member 10 and is formed from an electrically-conductive material such as tungsten or molybdenum. The electrostatic electrode 30 receives power from an external power supply (not shown), thereby generating electrostatic attraction on the holding surface 10*f*. The semiconductor wafer W is attracted to the holding surface 10*f* by this electrostatic attraction, thereby being held on the holding surface 10*f*.

While electrostatic attraction is being generated on the holding surface 10*f*, the semiconductor wafer W is in contact with the annular protrusion 12 and the protrusions 14, thereby being held on the holding surface 10*f*. In a state where the semiconductor wafer W is held on such a holding surface 10*f*, the inert gas is supplied between the semiconductor wafer W and the holding surface 10*f* in order to improve the heat conducting property between the semiconductor wafer W and the holding surface 10*f*. Specifically, the inert gas passes from the back surface 10*b* side through each of the penetrating flow paths 22 to the corresponding recess 16 from which the inert gas is supplied to the holding surface 10*f* side. The inert gas supplied to the holding surface 10*f* side flows in a space between the semiconductor wafer W and the recess 16 and is diffused over the entirety of the space.

Figure 2:
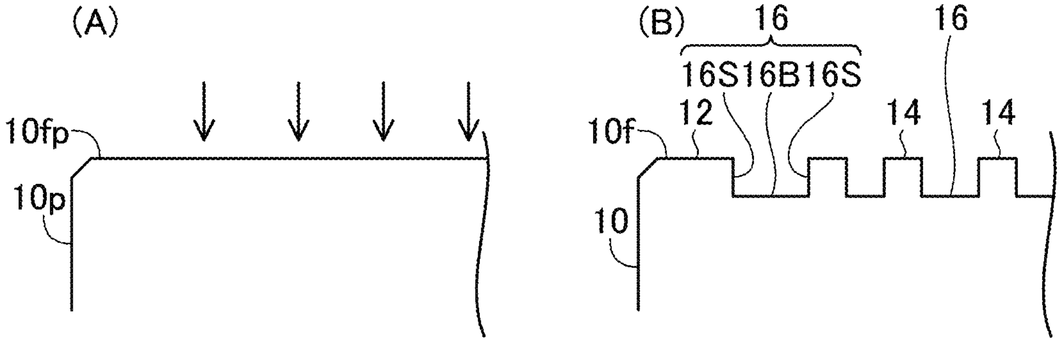
FIGS. 2A and 2B Diagrams showing a process of forming recesses.

FIGS. 2A and 2B are diagrams showing a process of forming the recesses 16. FIG. 2A shows a portion of a ceramic member 10*p* from which the holding member 10 is to be made. The ceramic member 10*p* has a processing-target surface 10*fp*. The processing-target surface 10*fp* is a surface that is to become the holding surface 10*f* of the holding member 10 in FIG. 1. The processing-target surface 10*fp* corresponds to a holding surface 10*f* on which the annular protrusion 12, the plurality of protrusions 14, and the plurality of recesses 16 are yet to be formed. The processing-target surface 10*fp* has recess-forming regions (not shown) in which the recesses 16 are to be formed. Each of the recess-forming regions is subjected to laser processing so that the corresponding recess 16 is formed in the recess-forming region. The laser processing is processing that involves applying laser light to an object to be processed. Each of the arrows shown in FIG. 2A indicates laser light being applied during the laser processing. Thus, the plurality of recesses 16 are formed. As a result, as shown in FIG. 2B described later, the recesses 16 are formed in the respective recess-forming regions, whereby the portions adjacent to the respective recesses 16 serve as the annular protrusion 12 and the plurality of protrusions 14. In the actual laser processing, laser light is applied to each of the recess-forming regions.

The laser light used in the laser processing is preferably ultrashort pulse laser light. The ultrashort pulse laser light is laser light having a pulse width within a range from a femtosecond region ($10^{-15}$) to a picosecond region ($10^{-10}$) and has a high energy density. In the case of using this ultrashort pulse laser light in processing for the recesses 16, the pulse width is shorter than the time that heat takes to be diffused from a processing-target portion irradiated with the laser light, and a material forming the processing-target portion is instantly evaporated before heat is transmitted to the periphery of the processing-target portion. Consequently, the processing can be accurately performed with little influence of heat.

FIG. 2B shows a portion of the holding member 10. Each of the recesses 16 has side surfaces 16S and a bottom surface 16B. Each of the side surfaces 16S is a surface delimiting the corresponding side of the recess 16. The bottom surface 16B is a surface delimiting the bottom of the recess 16. That is, the side surfaces 16S and the bottom surface 16B delimit the recess 16. As described above, the recess 16 is formed through the laser processing, and thus at least the bottom surface 16B out of the side surfaces 16S and the bottom surface 16B corresponds to a laser processing surface.

Figure 3:
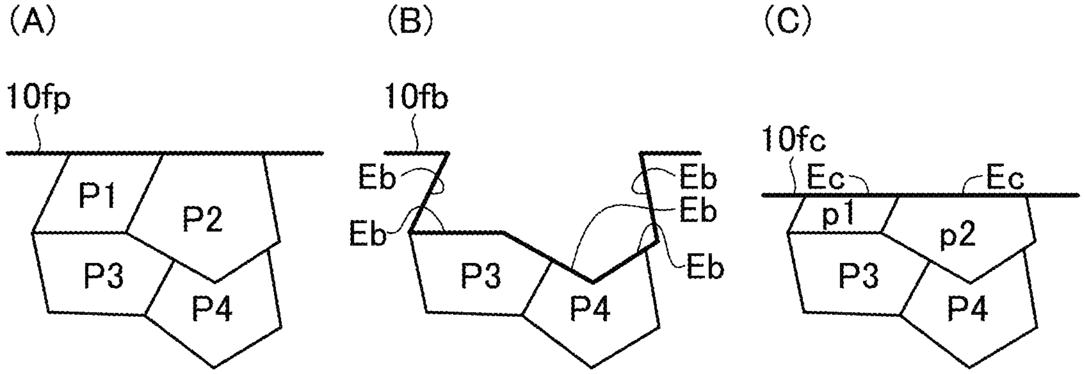
FIGS. 3A to 3C Diagrams schematically showing the shapes of ceramic crystal grains.

FIGS. 3A to 3C are diagrams schematically showing the shapes of ceramic crystal grains. FIG. 3A shows the shapes of ceramic crystal grains forming the vicinity of the processing-target surface 10*fp*. Lines delimiting respective crystal grains P1 to P4 indicate grain boundaries. FIG. 3B shows the shapes of ceramic crystal grains in a case where blast processing has been performed on the processing-target surface 10*fp* shown in FIG. 3A. The blast processing is processing that involves blasting an abrasive material at an object to be processed. A post-processing surface 10*fb* in FIG. 3B is a surface exposed by cutting the processing-target surface 10*fp* through the blast processing. FIG. 3C shows the shapes of ceramic crystal grains in a case where the laser processing has been performed on the processing-target surface 10*fp* shown in FIG. 3A. A post-processing surface 10*fc* in FIG. 3C is a surface exposed by cutting the processing-target surface 10*fp* through the laser processing. In FIGS. 3A to 3C, the processing-target surface 10*fp*, the post-processing surface 10*fb*, and the post-processing surface 10*fc* are indicated by thick lines.

The fact that the grain diameter of ceramic crystal grains forming the post-processing surface varies depending on the type of processing to be performed on the processing-target surface 10*fp* will be described with reference to FIGS. 3A to 3C. In FIG. 3B, exposed portions Eb of the post-processing surface 10*fb* are portions at which grain boundaries are exposed as a result of separating the crystal grains P1 and P2 by performing the blast processing on the processing-target surface 10*fp*. The blast processing involves separating crystal grains over the entireties thereof along respective grain boundaries by blasting the abrasive material, and thus, as shown in FIG. 3B, the surface roughness of the post-processing surface 10*fb* easily increases, and furthermore, the area of grain boundaries to be exposed from the post-processing surface 10*fb* also easily increases. Meanwhile, in FIG. 3C, exposed portions Ec of the post-processing surface 10*fc* are portions at which, as a result of partially cutting the crystal grains P1 and P2 by performing the laser processing on the processing-target surface 10*fp*, the inside of each of these grains (the inner portion of the grain relative to a corresponding grain boundary) is exposed. Crystal grains p1 and p2 shown in FIG. 3C correspond to the crystal grains P1 and P2 having been partially cut. The laser processing involves finely cutting each of crystal grains progressively from a corresponding grain boundary toward the inside of the grain, and thus, as shown in FIG. 3C, the surface roughness of the post-processing surface 10*fc* does not easily increase, and the area of grain boundaries to be exposed from the post-processing surface 10*fc* does not easily increase, either. In addition, since the inside of each of the grains is easily exposed from the post-processing surface 10*fc*, the grain diameter of ceramic crystal grains forming a surface as the post-processing surface 10*fc* easily becomes smaller than the grain diameter of ceramic crystal grains forming the processing-target surface 10*fp* and the post-processing surface 10*fb*.

As described above, the plurality of recesses 16 are formed by performing the laser processing on the processing-target surface 10*fp*, and at least the bottom surface 16B out of the side surfaces 16S and the bottom surface 16B corresponds to a laser processing surface. Thus, as described with reference to FIG. 3C, ceramic crystal grains (e.g., the crystal grains p1 and p2 in FIG. 3C) forming the bottom surface 16B have been at least partially cut through the laser processing, and thus the grain diameter of these ceramic crystal grains is smaller than the grain diameter of ceramic crystal grains (e.g., the crystal grains P3 and P4 in FIG. 3C) forming the inner portion of the holding member 10 relative to the holding surface 10*f*. In the following description, the ceramic crystal grains forming the bottom surface 16B are referred to as first ceramic crystal grains, and the grain diameter of the first ceramic crystal grains is referred to as a first grain diameter. Likewise, the ceramic crystal grains forming the inner portion of the holding member 10 relative to the holding surface 10*f* are referred to as second ceramic crystal grains, and the grain diameter of the second ceramic crystal grains is referred to as a second grain diameter. That is, the bottom surface 16B of the holding member 10 is a surface formed from the first ceramic crystal grains, and the first grain diameter thereof is smaller than the second grain diameter. Both the first ceramic crystal grains and the second ceramic crystal grains are grains forming the holding member 10. This means that, even when a coating is formed on the holding surface 10*f*, crystal grains forming a layer formed of the coating do not correspond to the first ceramic crystal grains. The first ceramic crystal grains and the second ceramic crystal grains are formed from the same ceramic material. That is, comparison in magnitude of the first grain diameter and the second grain diameter is performed between these kinds of crystal grains formed from the same material.

The fact that the first grain diameter is smaller than the second grain diameter can be ascertained through comparison between a result of performing measurement on the holding surface 10*f* through thin film X-ray diffraction (thin film XRD) and a result of performing measurement on the inside of the holding member 10 through ordinary X-ray diffraction (XRD). Here, the thin film XRD is XRD that involves causing X-rays to be incident on a surface of a measurement target at a small angle (e.g., 1° or smaller). The XRD involves causing X-rays to be incident toward the inside of a measurement target. For the comparison, the values of widths at half maximum measured in the thin film XRD and the XRD are used. Specifically, the fact that the first grain diameter is smaller than the second grain diameter is ascertained on the basis of the fact that the value of the width at half maximum in the measurement result of the thin film XRD is larger than the value of the width at half maximum in the measurement result of the XRD. Also, each of the value of the first grain diameter and the value of the second grain diameter can be calculated, from the value of the corresponding width at half maximum, by using the Scherrer equation expressed as the following expression (1).

$$r=(K\cdot\lambda)/\beta\cos\theta \qquad (1)$$

r: grain diameter

K: Scherrer constant

λ: wavelength of X-rays used in measurement

β: width at half maximum

θ: Bragg angle

In the present embodiment, the ceramic member 10*p* (FIG. 2A) to be subjected to the laser processing is formed from α-alumina, and thus the inner portion of the holding member 10 relative to the holding surface 10*f* is also formed from the α-alumina. Meanwhile, the vicinity of at least the bottom surface 16B out of the side surfaces 16S and the bottom surface 16B is formed from γ-alumina obtained by transition from the α-alumina due to the laser processing. The presence of the γ-alumina is ascertained on the basis of the fact that the relative intensity has become high near a peak position of the γ-alumina in an XRD pattern obtained by performing measurement on the holding surface 10*f* through the thin film XRD.

Since the first ceramic crystal grains correspond to ceramic crystal grains obtained by partially cutting the second ceramic crystal grains through the laser processing, the ceramic crystal grains forming at least the bottom surface 16B out of the side surfaces 16S and the bottom surface 16B delimiting the recess 16 include ceramic crystal grains (e.g., the crystal grains p1 and p2 in FIG. 3C) each having an inside that is exposed toward the surface as the bottom surface 16B.

In observation of a cross section of the holding member 10 by using an SEM, a plurality of minute pores (cavities) were found near the bottom surfaces 16B. The shapes of the ceramic crystal grains forming the bottom surfaces 16B had tendencies to be rounded to a larger extent than the shapes of the ceramic crystal grains forming bottom surfaces of recesses formed through the blast processing. The lengths of cracks extending from inside the holding member 10 to the bottom surfaces 16B had tendencies to be shorter than the lengths of cracks extending from inside the holding member 10 to the bottom surfaces of the recesses formed through the blast processing. The number of the cracks extending from inside the holding member 10 to the bottom surfaces 16B had a tendency to be smaller than the number of the cracks extending from inside the holding member 10 to the bottom surfaces of the recesses formed through the blast processing. As described with reference to FIGS. 3B and 3C, the surface roughnesses of the bottom surfaces 16B had tendencies to be lower than the surface roughnesses of the bottom surfaces of the recesses formed through the blast processing.

As described above, according to the holding member 10 of the present embodiment, at least the bottom surfaces 16B of the holding surface 10*f* are formed from the first ceramic crystal grains, and the inner portion of the holding member 10 relative to the holding surface 10*f* is formed from the second ceramic crystal grains. Furthermore, the first grain diameter as the grain diameter of the first ceramic crystal grains is smaller than the second grain diameter as the grain diameter of the second ceramic crystal grains. Consequently, since at least the bottom surfaces 16B of the holding surface 10*f* are formed from the first ceramic crystal grains having the first grain diameter smaller than the second grain diameter, the sizes of particles to be generated from the holding surface 10*f* at the time of using the holding member 10 can be decreased. In addition, the first ceramic crystal grains correspond to ceramic crystal grains obtained by partially cutting the second ceramic crystal grains, and thus each of the bottom surfaces 16B formed from the first ceramic crystal grains contains ceramic crystal grains each having an inside (the inner portion of the crystal grain relative to a corresponding grain boundary) that is exposed toward the bottom surface 16B. That is, less grain boundaries are exposed from the bottom surface 16B, whereby the plasma resistance of the holding surface 10*f* including such a bottom surface 16B can be improved.

In addition, according to the holding member 10 of the present embodiment, the grain diameter (second grain diameter) of the ceramic crystal grains forming the inner portion of the holding member 10 relative to the holding surface 10*f* is larger than the grain diameter (first grain diameter) of the ceramic crystal grains forming the bottom surface 16B. When the grain diameter of crystal grains is small, the grains are in contact with each other to a larger extent, whereby heat loss tends to increase. Meanwhile, in the holding member 10 of the present embodiment, the grain diameter of the ceramic crystal grains forming the inner portion of the holding member 10 relative to the holding surface 10*f* is the second grain diameter larger than the first grain diameter, and thus the grains in this portion are in contact with each other to a smaller extent, whereby the heat loss at this portion can be decreased.

In addition, in the holding member 10 of the present embodiment, the bottom surface 16B delimiting each of the recesses 16 is formed from the first ceramic crystal grains. Consequently, the sizes of particles to be generated, while the holding member 10 is holding the semiconductor wafer W as a target object, from the holding surface 10*f* by flow of an inert gas between the semiconductor wafer W and the recess 16 can be decreased.

In addition, in the holding member 10 of the present embodiment, at least the bottom surface 16B out of the side surfaces 16S and the bottom surface 16B corresponds to a laser processing surface. Consequently, the bottom surface 16B as a laser processing surface is a surface obtained by finely cutting each of the ceramic crystal grains progressively from a corresponding grain boundary toward the inside of the grain, and thus the first grain diameter of the first ceramic crystal grains is smaller than the second grain diameter. Therefore, a holding member 10 in which the first grain diameter is smaller than the second grain diameter can be accurately provided. In addition, the surface roughness of the laser processing surface can be made lower than the surface roughness of a blast processing surface obtained by performing blast processing that involves separating crystal grains over the entireties thereof along respective grain boundaries. That is, increase in surface area due to surface roughness can be suppressed. As a result, the surface area within which corrosion due to plasma occurs is decreased, whereby generation of particles through corrosion due to plasma can be suppressed.

In addition, according to the electrostatic chuck 1 of the present embodiment, electrostatic attraction (attracting force) is generated by supplying power to the electrostatic electrode 30, and the semiconductor wafer W can be held on the holding surface 10*f* side by this electrostatic attraction. In addition, since the first grain diameter is smaller than the second grain diameter, it is possible to provide an electrostatic chuck 1 in which: the sizes of particles to be generated from the holding surface 10*f* at the time of using the holding member 10 are decreased; and furthermore, the plasma resistance is improved.

Second Embodiment

Figure 4:
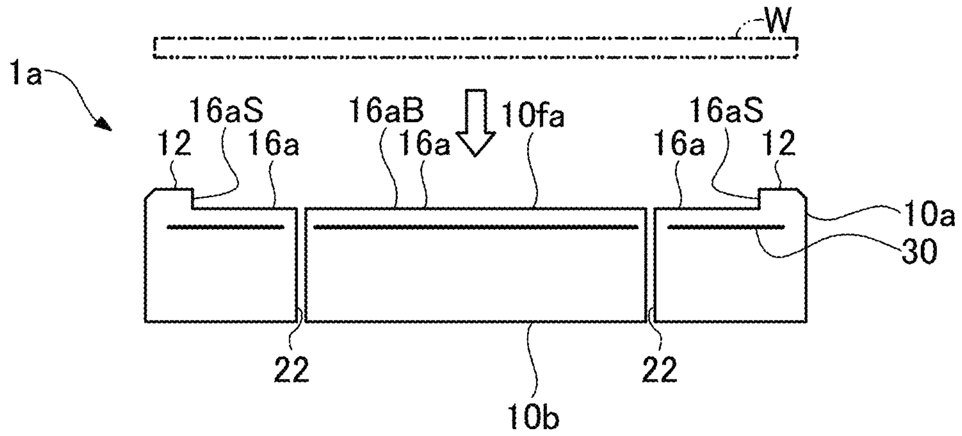
FIG. 4 Diagram schematically showing a cross-sectional configuration of an electrostatic chuck of a second embodiment.

FIG. 4 is a diagram schematically showing a cross-sectional configuration of an electrostatic chuck 1*a* of a second embodiment. In comparison with the electrostatic chuck 1 (see FIG. 1) of the first embodiment, the electrostatic chuck 1*a* of the second embodiment is the same as the electrostatic chuck 1 (see FIG. 1) of the first embodiment, except that the protrusions 14 are not formed on the inner side relative to the annular protrusion 12.

The electrostatic chuck 1*a* includes a holding member 10*a* having a holding surface 10*fa*. On the holding surface 10*fa*, the protrusions 14 shown in FIG. 1 are not formed, and the annular protrusion 12 and a recess 16*a* are formed. The recess 16*a* corresponds to the entirety of the inner portion of the holding surface 10*fa* relative to the annular protrusion 12. When the holding surface 10*fa* is viewed in such a direction as to face the holding surface 10*fa* (in a plan view), the recess 16*a* is formed in a circular shape on the inner side relative to the annular protrusion 12. The recess 16*a* is formed through the laser processing in the same manner as the plurality of recesses 16 shown in FIG. 1. That is, out of a side surface 16*a*S and a bottom surface 16*a*B delimiting the recess 16*a*, at least the bottom surface 16*a*B corresponds to a laser processing surface. Therefore, the grain diameter (corresponding to the first grain diameter) of ceramic crystal grains forming the bottom surface 16*a*B is smaller than the grain diameter (corresponding to the second grain diameter) of ceramic crystal grains forming the inner portion of the holding member 10*a* relative to the holding surface 10*fa*. In such a holding member 10*a* of the second embodiment as well, it is possible to: decrease the sizes of particles to be generated from the holding surface 10*fa* at the time of using the holding member 10*a*; and furthermore, improve the plasma resistance of the holding surface 10*f*.

Modifications of Embodiments

The present invention is not limited to the above embodiments and may be implemented in various embodiments without deviating from the gist of the present invention. For example, the following modifications are also possible.

In the first embodiment, the annular protrusion 12, the plurality of protrusions 14, and the plurality of recesses 16 are formed on the holding surface 10*f*. However, the present invention is not limited thereto. For example, on the holding surface 10*f*, the plurality of protrusions 14 and the plurality of recesses 16 may be formed without forming the annular protrusion 12.

In each of the above embodiments, the plurality of penetrating flow paths 22 are formed inside the holding member 10, 10*a*. However, the present invention is not limited thereto. For example, inside the holding member 10, 10*a*, a flow path connecting the plurality of penetrating flow paths 22 to each other inside the holding member 10 and a flow path branching off from the flow path to be connected to the recess 16 may be formed in addition to the penetrating flow paths 22.

In each of the above embodiments, the bottom surface 16B, 16*a*B is formed from the first ceramic crystal grains. However, the present invention is not limited thereto. The range of the surface formed from the first ceramic crystal grains may be arbitrarily determined as long as the surface is a surface as at least a portion of the holding surface. For example, the surface formed from the first ceramic crystal grains may be the entirety of the holding surface. Also, in each of the above embodiments, the bottom of the recess 16, 16*a* is shown as an angulated bottom, and the bottom surface 16B, 16*a*B delimiting the bottom has been described as a surface formed from the first ceramic crystal grains. However, without limitation thereto, in a case where the bottom of the recess is a rounded bottom without being angulated, the vicinity of this bottom may be a surface formed from the first ceramic crystal grains.

In each of the above embodiments, the bottom surface 16B, 16*a*B formed from the first ceramic crystal grains is a laser processing surface. However, the present invention is not limited thereto. For example, as long as the first grain diameter is smaller than the second grain diameter, the surface formed from the first ceramic crystal grains may be formed by performing: laser processing in which laser light different from ultrashort pulse laser light is used; or another arbitrarily-selected processing different from the laser processing.

Each of the electrostatic chucks of the above embodiments may further include, inside the holding member, a plurality of heater electrodes formed from an electrically-conductive material such as tungsten or molybdenum. In such an embodiment, while a target object is being held by the holding member, the target object can be warmed through heat generation by the heater electrodes with power supplied from the external power supply.

In each of the electrostatic chucks of the above embodiments, a plate-shaped base member may be further joined to the back surface of the holding member. In a case where a coolant flow path is formed inside the base member, a coolant flows inside the coolant flow path while a target object is being held by the holding member, whereby the target object can be cooled from the base member via the holding member.

While the present aspect has been described above using the embodiments and the modifications, the embodiments described above are merely for facilitating the understanding of the present aspect and are not intended to limit the present aspect. The present aspect may be subjected to change or modification without deviating from the gist thereof and the scope of the claims, and the present aspect includes equivalents thereof. Further, such technical features can be deleted as appropriate if not described as being essential in the present specification.

The present invention can be implemented in the following aspects as well.

Application Example 1

A holding member containing ceramic as a main component and configured to hold a target object, wherein the holding member has a holding surface as a surface on a side on which the target object is held, a surface as at least a portion of the holding surface is formed from first ceramic crystal grains, an inner portion of the holding member relative to the holding surface is formed from second ceramic crystal grains, and a first grain diameter as a grain diameter of the first ceramic crystal grains is smaller than a second grain diameter as a grain diameter of the second ceramic crystal grains.

Application Example 2

The holding member in accordance with application example 1, wherein a protrusion and a recess are formed on the holding surface, and the surface is a bottom surface delimiting the recess.

Application Example 3

The holding member in accordance with application example 1 or 2, wherein the surface is a laser processing surface.

Application Example 4

An electrostatic chuck comprising:

the holding member in accordance with any one of application examples 1 to 3; and an electrostatic electrode configured to generate electrostatic attraction on the holding surface.

DESCRIPTION OF REFERENCE NUMERALS

1, 1*a*: electrostatic chuck
10, 10*a*: holding member
10*b*: back surface
10*f*, 10*fa*: holding surface
12: annular protrusion
14: protrusion
16, 16*a*: recess
16B, 16*a*B: bottom surface
16S, 16*a*S: side surface
22: penetrating flow path
30: electrostatic electrode

What is claimed is:

1. A holding member containing ceramic as a main component and configured to hold a target object, wherein the holding member has a holding surface as a surface on a side on which the target object is held, a surface as at least a portion of the holding surface is formed from first ceramic crystal grains, an inner portion of the holding member relative to the holding surface is formed from second ceramic crystal grains, and a first grain diameter as a grain diameter of the first ceramic crystal grains is smaller than a second grain diameter as a grain diameter of the second ceramic crystal grains.

2. The holding member in accordance with claim 1, wherein a protrusion and a recess are formed on the holding surface, and the surface is a bottom surface delimiting the recess.

3. The holding member in accordance with claim 2, wherein the surface is a laser processing surface.

4. An electrostatic chuck comprising:

the holding member in accordance with claim 1; and an electrostatic electrode configured to generate electrostatic attraction on the holding surface.

5. An electrostatic chuck comprising:

the holding member in accordance with claim 2; and an electrostatic electrode configured to generate electrostatic attraction on the holding surface.

6. An electrostatic chuck comprising:

the holding member in accordance with claim 3; and an electrostatic electrode configured to generate electrostatic attraction on the holding surface.

* * * * *